(12) United States Patent
Harting et al.

(10) Patent No.: US 6,312,287 B1
(45) Date of Patent: Nov. 6, 2001

(54) COAXIAL PLUG CONNECTOR

(75) Inventors: Dietmar Harting, Espelkamp; Günter Pape, Enger; Manfred Berghorn, Stolzenau, all of (DE)

(73) Assignee: Harting KGaA (DE)

( * ) Notice: Subject to any disclaimer, the term of this patent is extended or adjusted under 35 U.S.C. 154(b) by 0 days.

(21) Appl. No.: 09/655,674

(22) Filed: Sep. 6, 2000

(51) Int. Cl.⁷ .................................................. H01R 9/05
(52) U.S. Cl. ............................................................ 439/581
(58) Field of Search ........................ 439/581, 63, 891, 439/579, 608, 578, 108, 885

(56) References Cited

U.S. PATENT DOCUMENTS

| | | | |
|---|---|---|---|
| 4,099,615 | * 7/1978 | Lemke et al. | 206/329 |
| 4,887,981 | * 12/1989 | Damon et al. | 439/885 |
| 5,516,307 | * 5/1996 | Cartesse et al. | 439/581 |
| 5,577,935 | * 11/1996 | Harting et al. | 439/581 |
| 5,791,937 | 8/1998 | Kitajima et al. . | |
| 5,842,872 | * 12/1998 | Hosler et al. | 439/63 |
| 5,982,186 | * 11/1999 | Buschbom | 324/755 |

FOREIGN PATENT DOCUMENTS 0 555 933 A1    8/1993   (EP) .

* cited by examiner

Primary Examiner—Brian Sircus
Assistant Examiner—J. F. Duverne
(74) Attorney, Agent, or Firm—Cook, Alex, McFarron, Manzo, Cummings & Mehler, Ltd.

(57) ABSTRACT

A coaxial connector which is adapted for SMT mounting at a printed circuit board and which comprises at one side a plug-in connecting end and at the other side, towards the printed circuit board, a terminal end, the coaxial contact being comprised of an electrically conductive outer jacket and a signal contact formed in one part and being electrically isolated with respect to the outer jacket by means of a dielectric, at least the signal contact contacting the printed circuit board by means of SMT, is characterized in that at least the electrical connection of the signal contact to the printed circuit board is achieved by means of a contact sleeve which is inserted into a reception socket in an isolating carrier frame, sandwiched between the coaxial connector and the printed circuit board, the contact sleeve being placed in an automatic mounting process on a solder pad and being fixed there after a reflow solder bath.

19 Claims, 9 Drawing Sheets

COAXIAL PLUG CONNECTOR

The invention relates to a coaxial connector adapted to be mounted at a printed circuit board, having one or several double coaxial contacts which on one side comprise a plug-in connecting end and on the other side, towards the printed circuit board, a connecting end, the coaxial contact being comprised of an electrically conductive outer jacket and a signal contact being formed in one part and being isolated with respect to the outer jacket by means of a dielectric.

Coaxial connectors adapted to be soldered to a printed circuit board are known from the brochure "har-pak, High Density Connector System, 26 6, MO/16.10.98/6.0" of Harting, which however are not suitable for the SMT technique. These coaxial connectors are provided with press-in contacts, and the mechanical attachment on the printed circuit board is achieved by means of press-in pins.

Coaxial connectors adapted to be mounted at a printed circuit board and suitable for the SMT technique are known from the Siemens company brochure "Eine Verbindung, die voller Vorteile steckt, Siemax—der erste Multi Koax-Steckverbinder, Ausgabe: December 1998".

It is there provided that the complete coaxial connector is positioned on the printed circuit board for reflow soldering. In order to ensure that the reflow soldering technique can be used and in order to allow an inspection of the soldered points, the signal connector must not be completely shielded. This, however, limits the transmission characteristics.

As the connector protrudes over the printed circuit board edge and the regular limit which is set by the measurements of the printed circuit board is exceeded, additional steps are required during soldering.

The problem with connectors with SMT terminals and adapted to be mounted at the edge of printed circuit boards is that the pressing and traction forces of the complementary connector must under no circumstances act on the soldering pads as these, due to their low holding strength, would be torn from the printed circuit board, Rather, measures are to be taken for a strong mechanical attachment of the edge connector to the printed circuit board.

The object of the invention is to improve a coaxial connector of the type mentioned above so that at least the signal contacts are provided with SMT terminals and that an automatic standard mounting process can be used without requiring special measures with respect to an edge connector for a printed circuit board. Further, a reliable and endurable contact is to be achieved, even in cases of different expansion coefficients, during a temperature rise, and the coaxial connector is nevertheless to be mechanically fixed to the printed circuit board in. Furthermore, the signal contacts are to be completely shielded for higher transmission speeds.

This object is achieved by forming the connecting end of a signal contact in a plug-like manner and by inserting the connecting end into a contact sleeve which is held at a printed circuit board and is electrically connected thereto, the signal contact being connected in an electrically conductive manner with the printed circuit board.

Advantageous details of the invention are defined in claims 2 to 10.

The advantages achieved with the invention are in particular that the coaxial connector, due to the good shielding effect, reliably transmits even signals with higher frequency. The improved shielding is achieved by having the shield of the entire coaxial connector reach all the way down to the printed circuit board in a closed manner.

Further, the coaxial connector formed as edge connector for a printed circuit board can be mounted at the printed circuit board and subsequently soldered thereto in a reflow technique in a fully automatic manner without special measures of precaution, with the visual inspection of the soldering points being highly simplified as the soldering points at the printed circuit board are directly accessible. An improved mounting of the coaxial connector is the result of a division of the coaxial connector into a contact carrier housing having the double coaxial contacts, and a carrier frame having contact sleeves by means of which the signal contacts to be soldered are fixed to the printed circuit board. A significant advantage of this invention is that a reliable and endurable contact is achieved even in case of different material expansion of the coaxial connector and the printed circuit board during operation as the contact end of the signal contact formed as spherical heads in cooperation with correspondingly formed contact sleeves allow a compensation. Further, a good mechanical strength is ensured since the signal contacts and the contact carrier housing are fixed at the printed circuit board independent of each other.

An embodiment of the invention is shown in the drawing and explained in detail below. In the drawings, FIG. 1 shows a coaxial connector mounted at a printed circuit board, FIG. 2 shows a coaxial connector which has not yet been mounted at a printed circuit board provided with a carrier frame, FIG. 3 shows an exploded view of a printed circuit board, a carrier frame and a contact carrier housing having double coaxial contacts, FIG. 4 shows an enlarged view of the carrier frame, FIG. 5 shows a cross-section through an angled coaxial connector, FIG. 6 shows an enlarged view of a signal contact end in a contact sleeve, FIG. 7 shows an enlarged view of an obliquely oriented signal contact end in a contact sleeve, FIG. 8 shows an enlarged perspective view of a double coaxial contact, FIG. 9 shows a plurality of terminal embodiments of the contact sleeves, FIG. 10 shows a straight coaxial connector in a sectional view, and FIG. 11 shows an exploded perspective view of a straight coaxial contact.

A coaxial connector 1 shown in FIG. 1 in a perspective view is formed as a so-called edge connector for a printed circuit board and comprises a plurality of double coaxial contacts 3 arranged in a contact carrier housing 2 and mounted together with a sandwiched carrier frame 4 at a printed circuit board 5.

In FIG. 2 is shown the carrier frame 4 which is already mounted at the printed circuit board 5 and on which the contact carrier housing 2 with the double coaxial contacts 3 is to be mounted in a further step.

FIG. 3 shows in an exploded view the components printed circuit board 5, carrier frame 4 and coaxial connector 1 having the contact carrier housing 2 and the double coaxial contacts 3 mounted therein. On the printed circuit board 5, the plug-in configuration required for mounting the coaxial connector and having solder pads 6 and bores 7, 8, 9 can be seen.

During mounting the coaxial connector, first the carrier frame 4 with positioning sockets 11 and 11' is positioned in bores 9 and 9' on the printed circuit board 5 which positively results in the contact sleeves 14 held in reception sockets 15 at interconnection webs 16 of the carrier frame 4 being placed on soldering pads 6.

In this mounting condition, the carrier frame 4 together with the contact sleeves 14 held in reception sockets 15 is connected to the printed circuit board 5 in a reflow soldering bath.

The contact carrier housing 2 having the double coaxial contacts 3 inserted therein is mounted subsequent to the soldering process.

During mounting, the contact carrier housing 2 is pressed in a single step with the press-in pins 10 into bores 8 and 8' of the printed circuit board while additional holding pins 12 and 12' are inserted into opening 13 of positioning sockets 11 and 11' of the carrier frame 4. Furthermore, outer contact terminals 24 provided at the bottom region 26 of the double coaxial contacts 3 are pressed into bores 7 assigned thereto and arranged in the printed circuit board 5 in order to transmit the shielding effect of an outer jacket formed by an outer contact socket 28 and an outer contact body 29 to the ground potential of the printed circuit board 5.

FIG. 4 shows in an enlarged view the carrier frame 4 with the comb-like interconnecting webs 16 at which the contact sleeves 14 shown in detail in FIG. 9 are accommodated in corresponding reception sockets 15.

Furthermore, the positioning sockets 11 provided for positioning at the printed circuit board 5 are formed with openings 13, the lower region of the positioning sockets being slotted in the longitudinal direction and a transverse direction, respectively, so as to compensate for possible position variations between the carrier frame and the printed circuit board.

Forming the interconnection webs in this comb-like manner provides the advantage that the free spaces 17 and 23 achieved thereby can be used for a ground shield between the individual contacts on the printed circuit board.

The entire structure of an angled coaxial connector 1 mounted at a printed circuit board 5 is shown in FIG. 5 in a sectional view. A double coaxial contact 3 with two signal contacts 21 is provided in the contact carrier housing 2, the signal contacts each being electrically isolated from the outer jacket and embedded in a dielectric 25.

The outer jacket is formed by the outer contact body 29 and the outer contact sockets 28 which are connected in an electrically conductive manner. The spherical ends 19 of the two signal contacts 21 are inserted into the contact sleeves 14 and are conductively connected to the printed circuit board 5 through the solder pads 6, the contact sleeves 14 being held in the reception sockets 15 of the carrier frame 4 on the printed circuit board 5.

A free space 20 is provided below the reception sockets 15 for the solder flowing when heated.

The shielding as a whole comprises the contact carrier housing 2, the outer contact sockets 28, the outer contact body 29 and a shielding block 22 arranged between the two signal contacts 19, and extends into the bottom region 26 down to the surface of the printed circuit board 5, the transmission being made through the outer contact terminals 24 to conducting tracks of the printed circuit board.

FIG. 6 shows in a strongly enlarged sectional view the manner in which the contact end of a signal contact 21, formed as spherical head 19, is inserted into the recess 18 of a contact sleeve 14. Any misalignment which possibly occurs, as shown in FIG. 7, is largely compensated by means of the spherical configuration of the signal contact so as to prevent that a torque or shearing forces are transmitted from the signal contacts 21 to the contact sleeves 14.

FIG. 8 shows in an enlarged perspective view the individual double coaxial contacts 3 as viewed from the contact terminals. The signal contacts 21 are arranged in the interior of the outer contact body 29 formed as a shielded housing and of the outer contact sockets 28 attached thereto in an electrically conductive manner, the signal contacts 21 protruding with their spherical ends 19 into the bottom region 26. The mechanical attachment of the double coaxial contacts is achieved by means of the outer contact terminals 24 which are pressed into corresponding bores 7 at the printed circuit board 5. In order to achieve that the coaxial contact 3 is placed closely to the printed circuit board and to thereby achieve a good shielding, recesses 27 are provided at the longer of the side walls of the outer contact body 29, into which the interconnection webs 16 of the carrier frame 4 may be inserted during the final mounting.

FIG. 9 shows contact sleeves 14, 14.1, 14.2, 14.3 with outer contours formed in different manners, which are provided for insertion of the signal contacts 21, in particular of the spherical head ends 19. The contact sleeves 14 are typically held in the reception sockets 15 of the carrier frame 4.

According to an alternative, the carrier frame 4 together with the reception sockets 15 can be removed from the printed circuit board after the soldering process so that the contact sleeves 14 remain on the printed circuit board.

Figure 1:
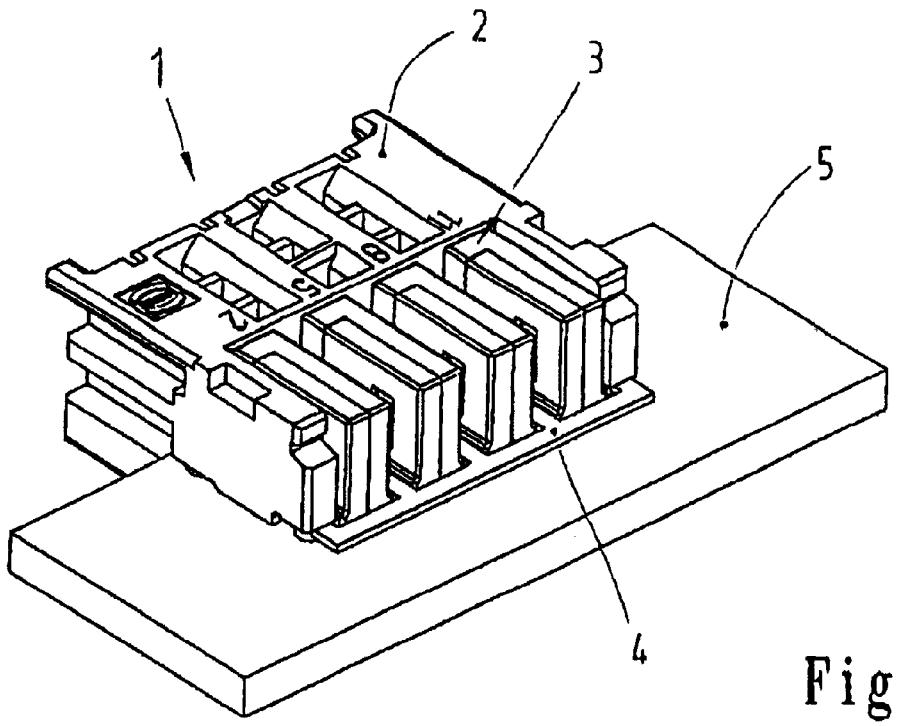
Figure 2:
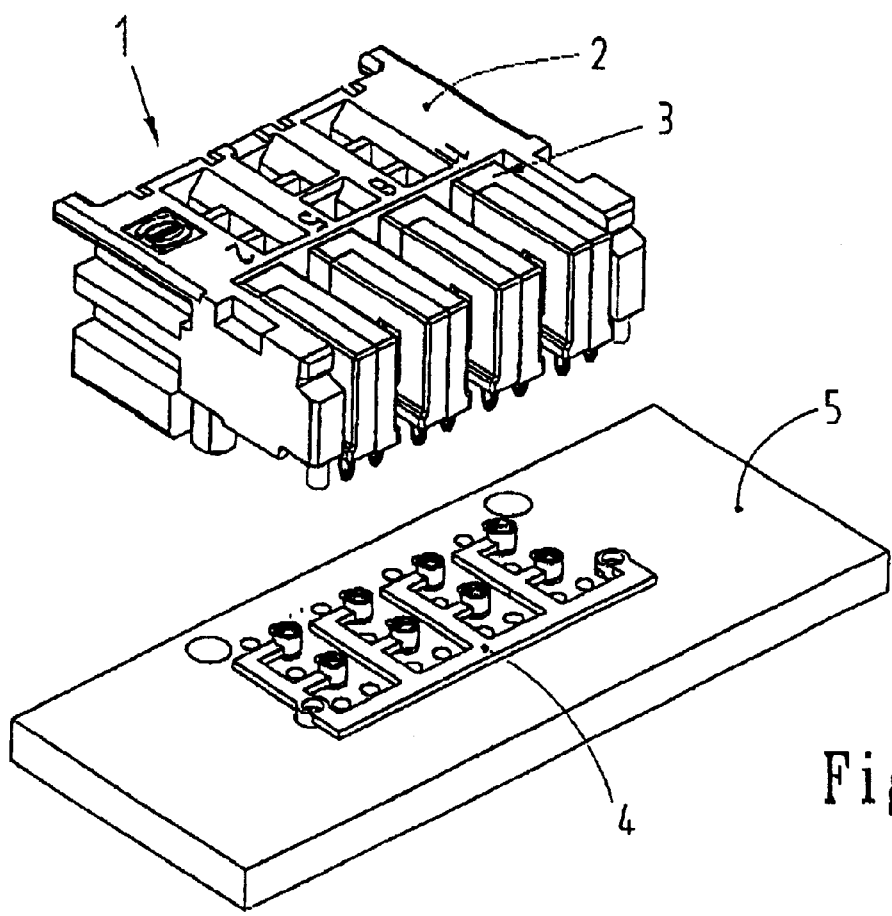
Figure 3:
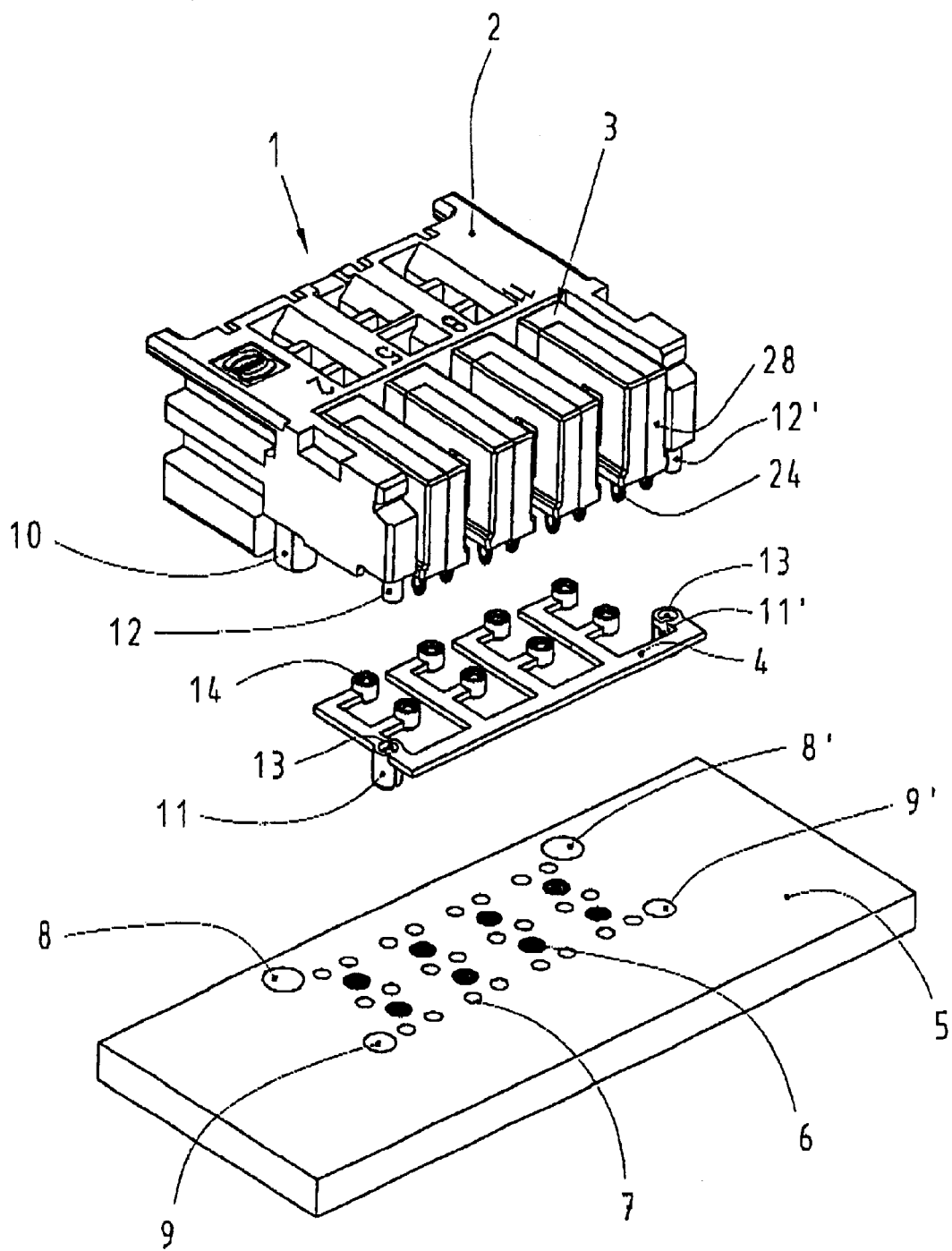
Figure 4:
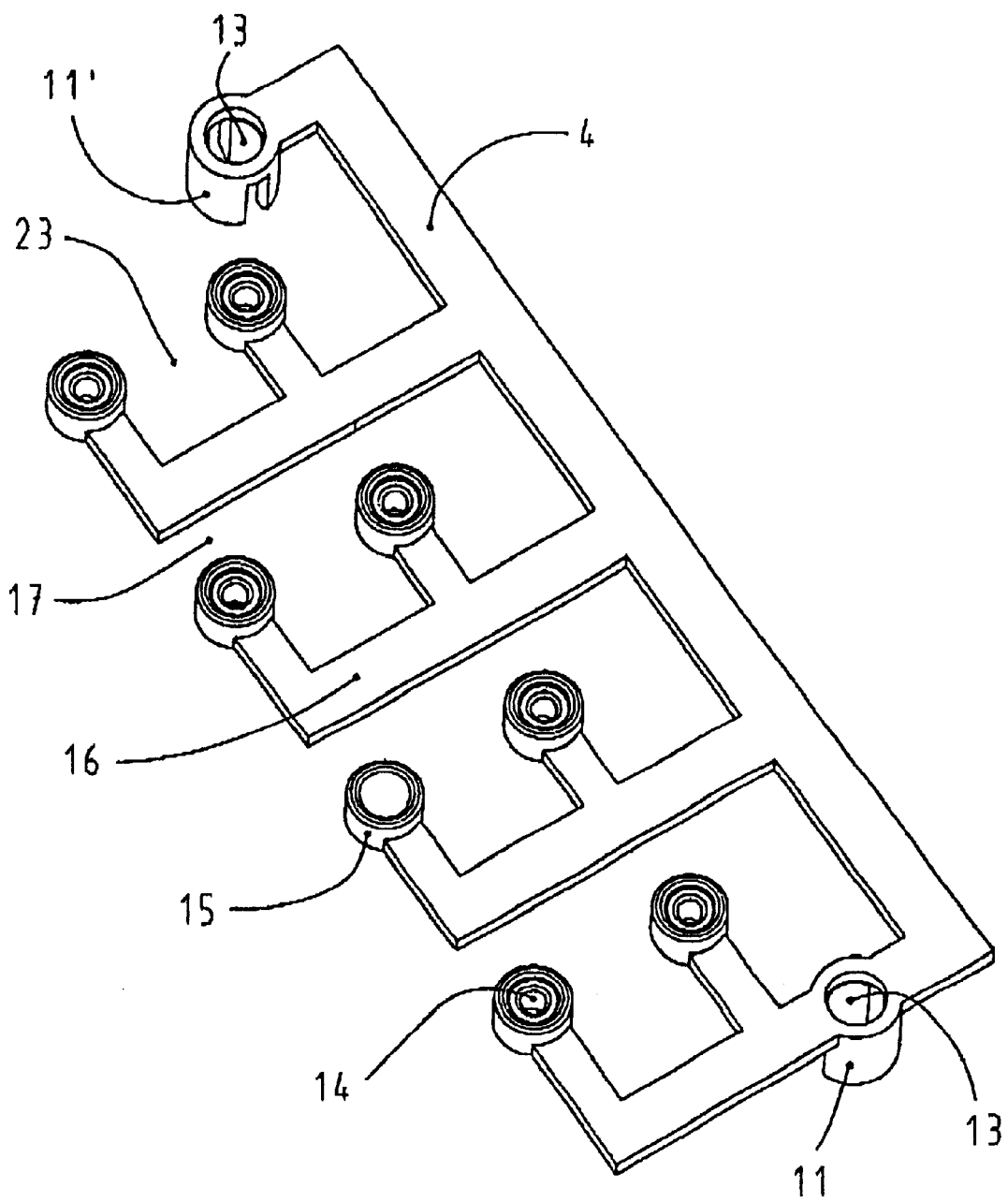
Figure 5:
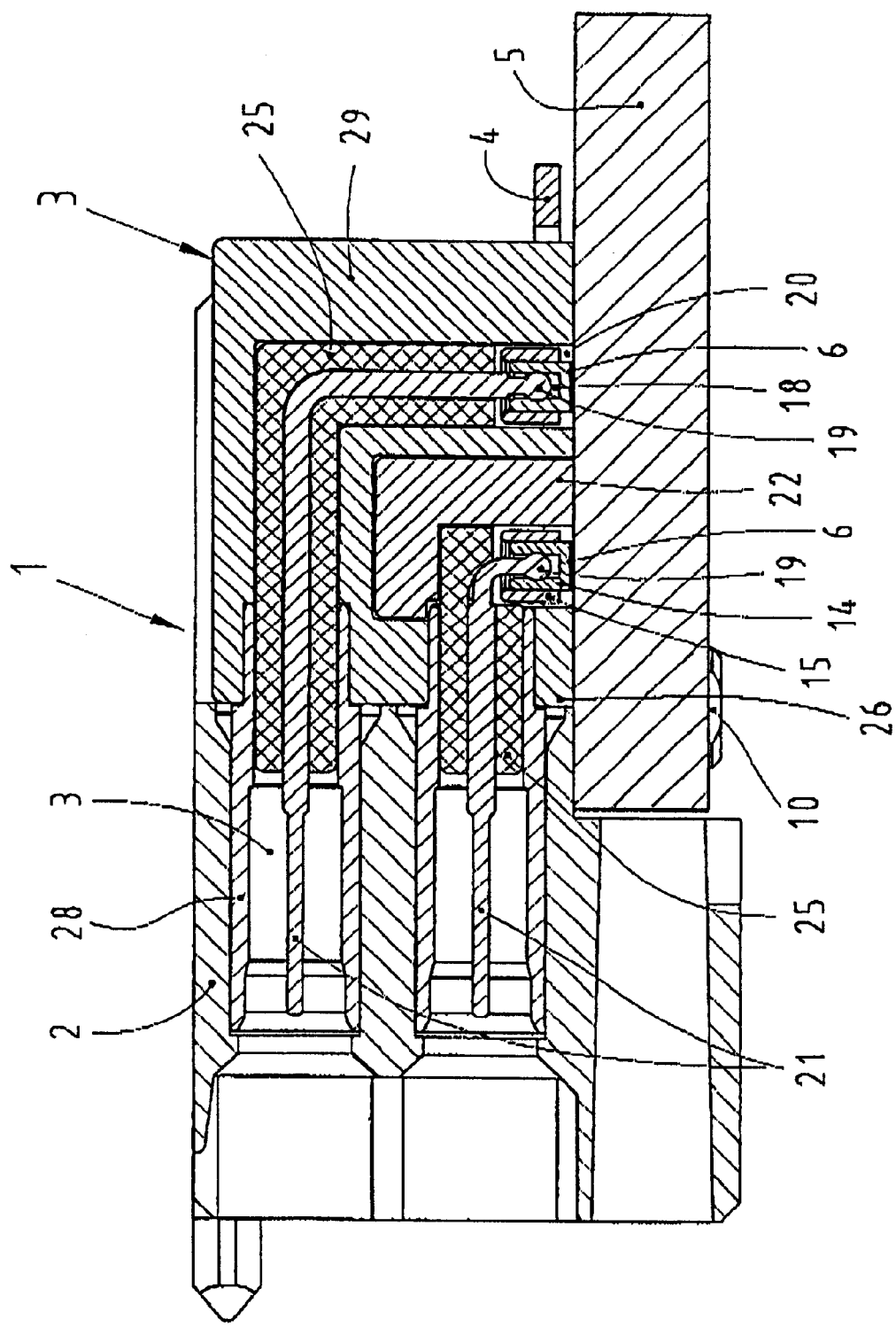
Figure 6:
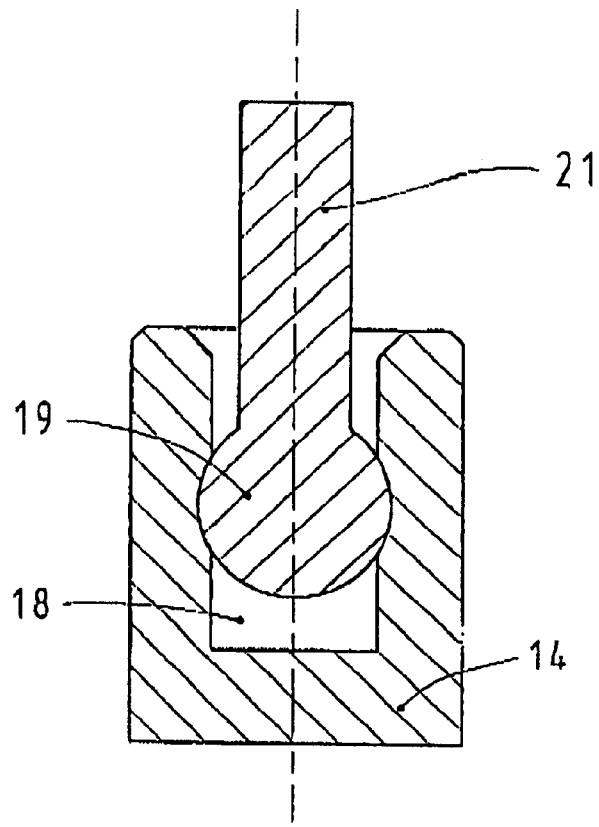
Figure 7:
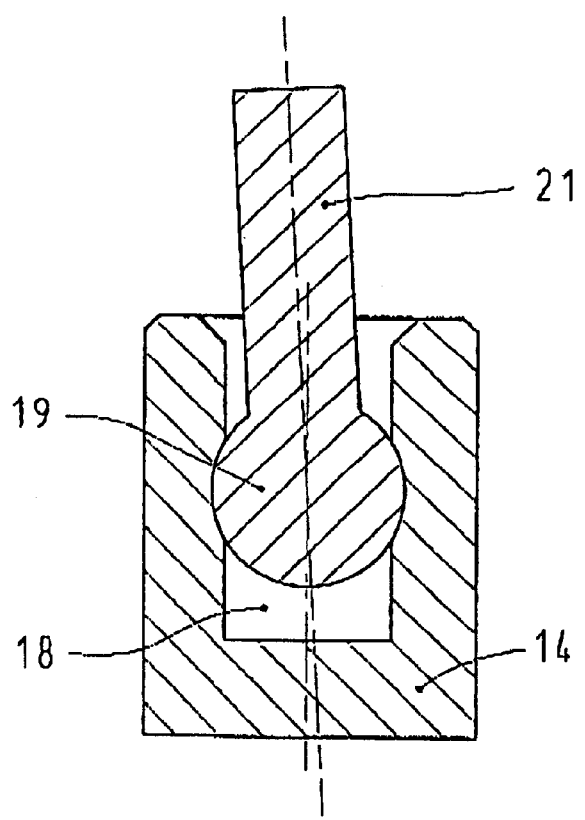
Figure 8:
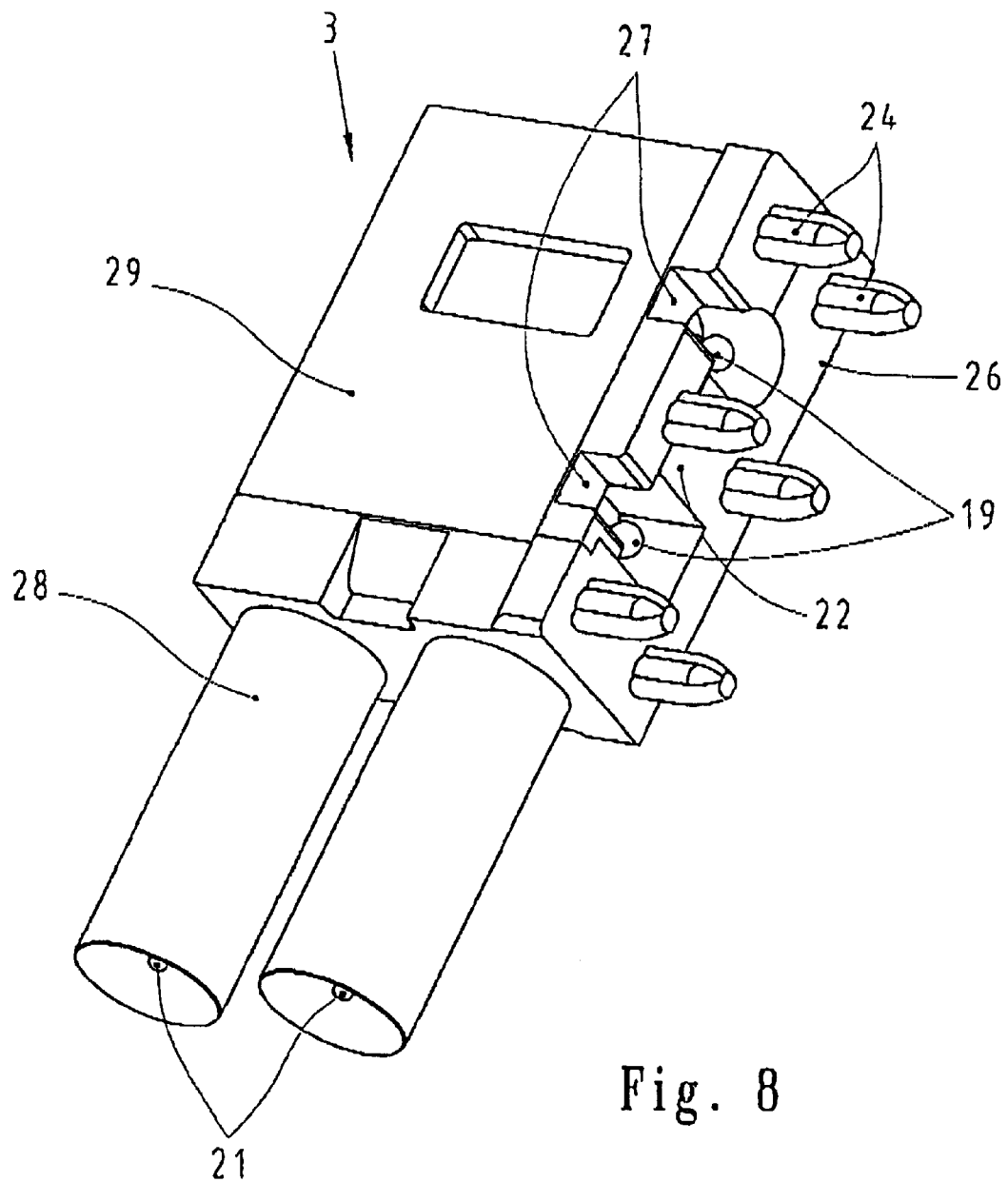
Figure 9:
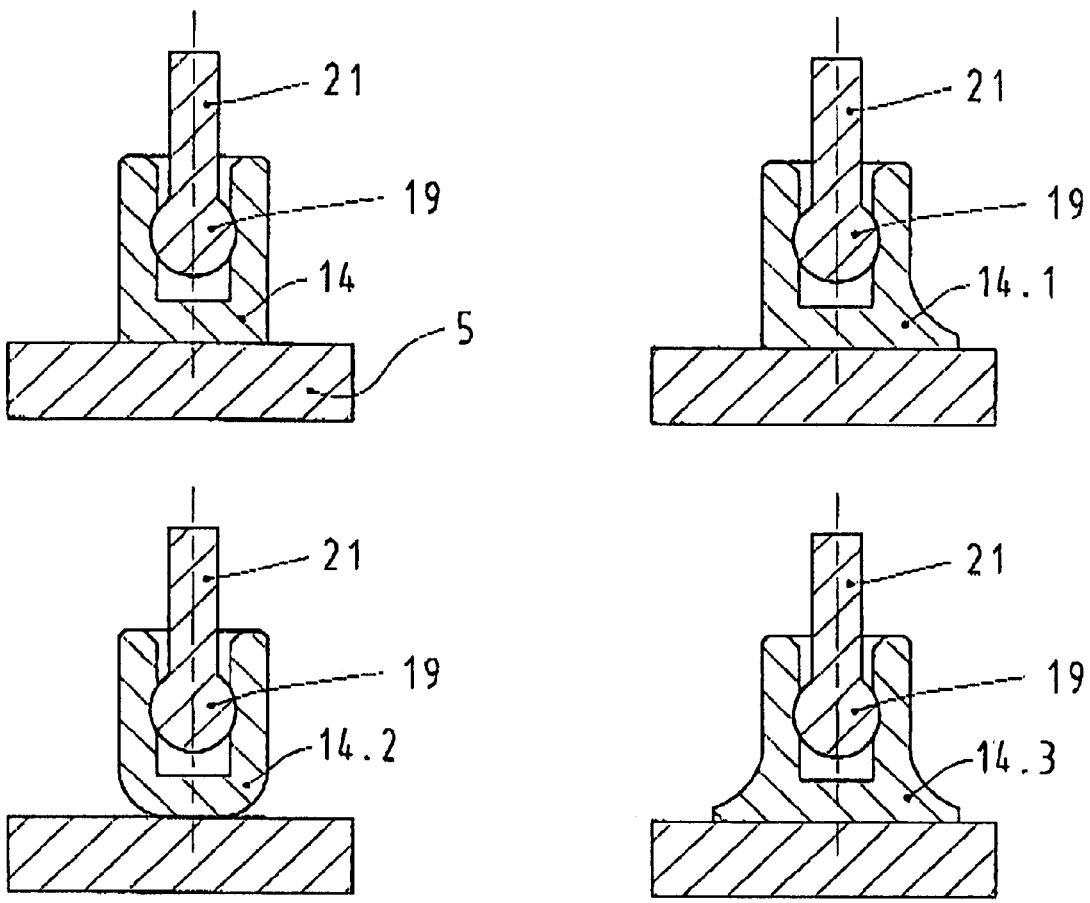
Figure 10:
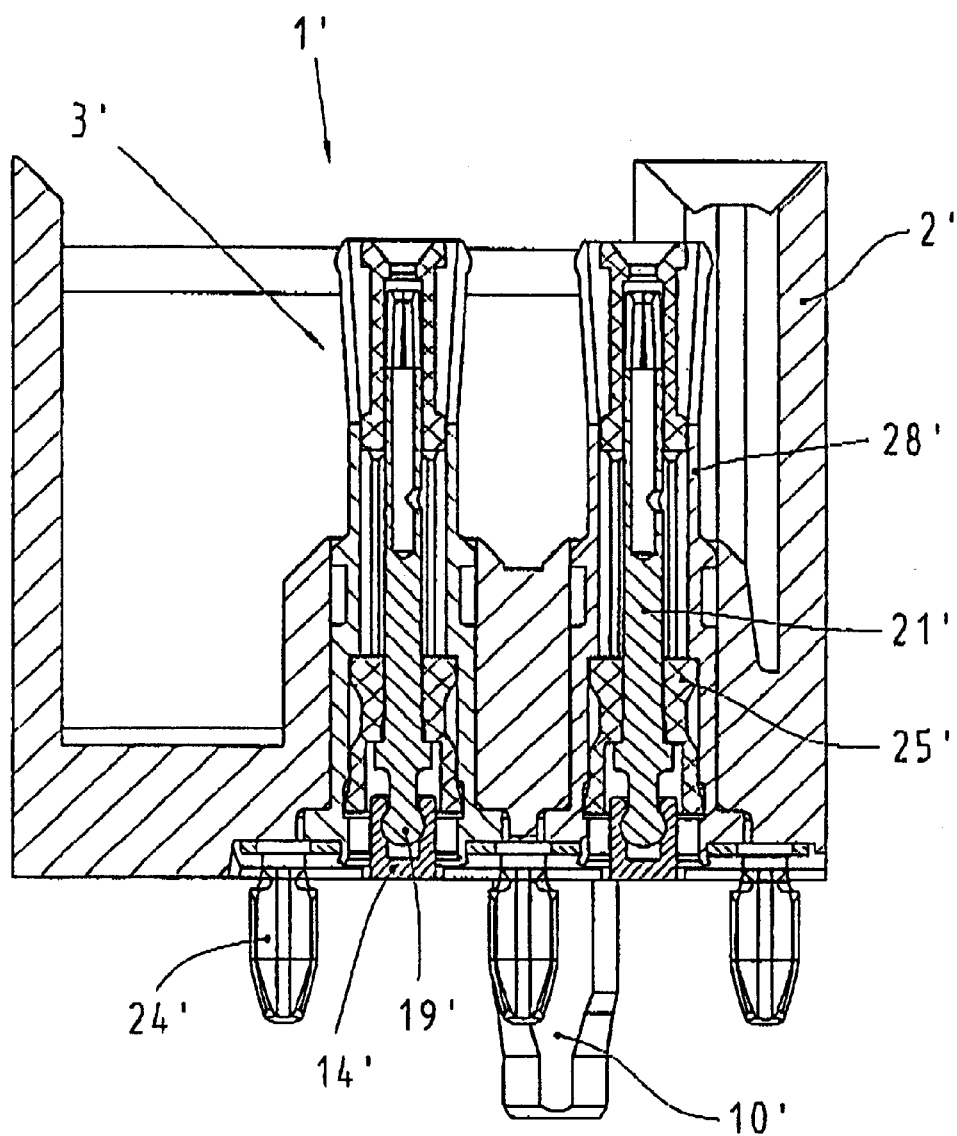
FIG. 10 shows a modified coaxial connector 1' which is, with respect to the signal contacts 21', not formed In an angled version, but in a straight version.
Figure 11:
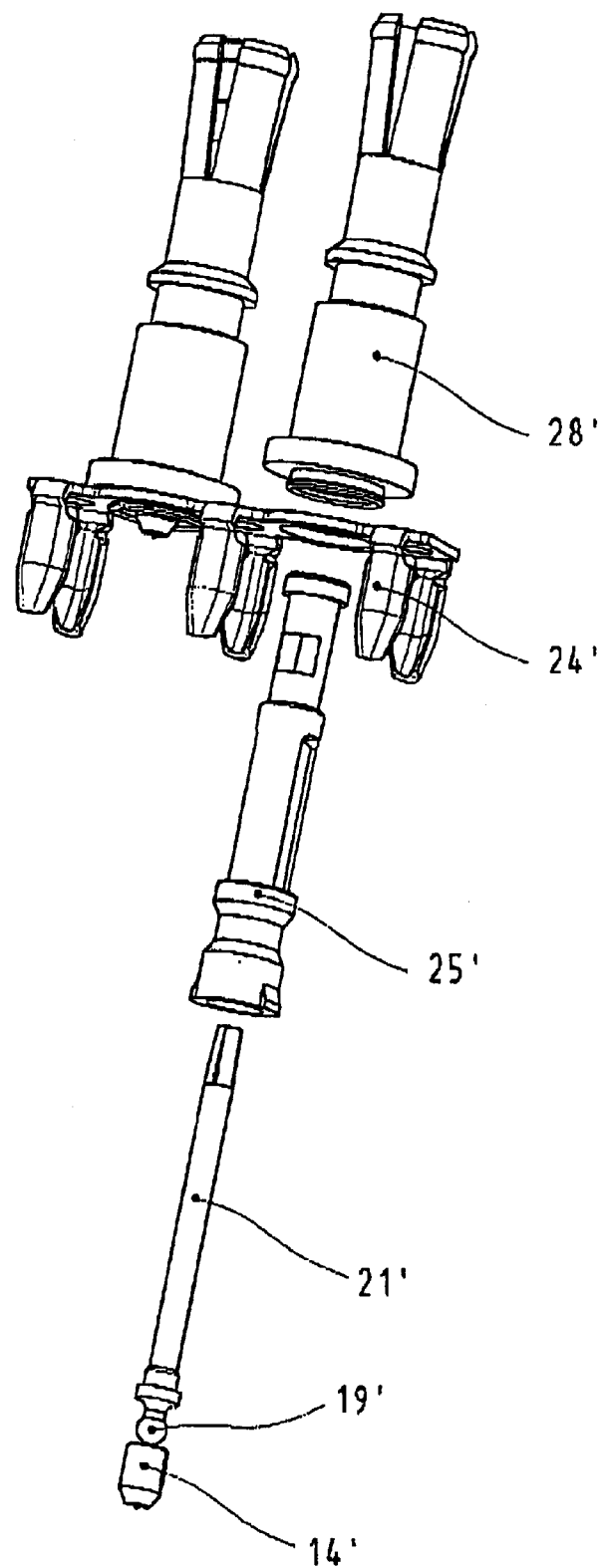
FIG. 11 shows in an exploded perspective view the inner, signal transmitting components which regarding their construction correspond to the embodiment described above.

Reference numerals used in FIGS. 10 and 11 correspond to those used for the angled coaxial connector, but are provided with a prime for differentiation.

What is claimed is:

1. A coaxial connector adapted to be mounted at a printed circuit board having one or several double coaxial contacts (3), which at one side have a plug-in connecting end and at the other side, towards the printed circuit board, have a connecting end, the coaxial contact (3) being comprised of an electrically conductive outer jacket (28, 29) and a signal contact (21) formed in a single part and being isolated with respect to the outer jacket by means of a dielectric (25), characterized in that the connecting end of the signal contact (21) is formed in the form of a plug and in that the connecting end of the signal contact (21) is inserted into a contact sleeve (14) and is electrically connected thereto, the contact sleeve (14) being electrically connected to the printed circuit board (5) without penetration thereof so that the signal contact (21) is connected to the printed circuit board in an electrically conductive manner.

2. The coaxial connector of claim 1, characterized in that the connecting end of the signal contact (21) is formed as spherical head (19).

3. The coaxial connector of claim 2, characterized in that the contact sleeves (14) are held in reception sockets (15) of a carrier frame (4) formed from an isolating material.

4. The coaxial connector of claim 2, characterized in that the contact sleeves (14) comprise different constructions (14.1, 14.2, 14.3) for an electrical connection to the printed circuit board (5).

5. The coaxial connector of claim 3, characterized in that positioning sockets (11, 11') are formed at the carrier frame (4), the positioning sockets dipping into corresponding bores (8, 8') in the printed circuit board (5) for positioning.

6. The coaxial connector of claim 5, characterized in that the positioning sockets (11, 11') at the carrier frame (4) comprise openings (13) in which attachment pins (12, 12') of a contact carrier housing (2) engage and in that the positioning sockets (11, 11') are slit at their plug-in side.

7. The coaxial connector of claim 3, characterized in that the contact sleeves (14) are fixedly connected to the carrier frame (4).

8. The coaxial connector of claim 3, characterized in that the contact sleeves (14) are formed detachable from the carrier frame (4).

9. The coaxial connector of claim 3, characterized in that interconnection webs (16) of the carrier frame (4) are adapted to be inserted into recesses (27) in a bottom region (26) of the coaxial contact (3).

10. The coaxial connector of claim 1, characterized in that the electrically conductive outer jacket of one of the double coaxial contacts (3) is comprised of an outer contact body (29), at least one outer contact socket (28) and of outer contacts (24).

11. A coaxial connector mountable to a printed circuit board, the printed circuit board having a planar surface and a plurality of spaced conductive solder pads (6) placed on the planar surface, the coaxial connector having a plug-in connecting end for receiving a complementary connector and a connecting end adapted for mounting to the printed circuit board and including a contact carrier housing (2), a plurality of signal contacts (21) being electrically isolated from each other and mounted in the contact carrier housing (2), and a plurality of contact sleeves (14) attachable to at least one of the contact carrier housing (2) and the printed circuit board (5) such that when the coaxial connector is mounted to the printed circuit board the plurality of contact sleeves (14) are sandwiched between the contact carrier housing (2) and the printed circuit board (5) with each contact sleeve (14) being in electrical engagement with one of the plurality of spaced conductive solder pads (6) on the planar surface of the printed circuit board (5), each signal contact (21) having a connecting end which is insertable into one of the plurality of contact sleeves (14) for electrical engagement therewith so that each signal contact (21) is in electrical engagement with one of the plurality of spaced conductive solder pads (6) on the planar surface of the printed circuit board (5).

12. The coaxial connector of claim 11 wherein the connecting end of the signal contact (21) is formed as a spherical head (19).

13. The coaxial connector of claim 12 further comprising a carrier frame (4) which includes reception sockets (15) and is formed from an isolating material, the contact sleeves (14) being held in the reception sockets (15) of the carrier frame (4).

14. The coaxial connector of claim 13 wherein the carrier frame (4) includes positioning sockets (11, 11') formed therein, the positioning sockets being insertable into corresponding bores (8, 8') in the printed circuit board (5) for positioning.

15. The coaxial connector of claim 14 wherein the contact carrier housing (2) includes attachment pins (12, 12'), the positioning sockets (11, 11') of the carrier frame (4) defining openings (13) and including a lower region which has slots defined therein so that the attachment pins (12, 12') are insertable into the openings (13).

16. The coaxial connector of claim 13 wherein the contact sleeves (14) are fixedly connected to the carrier frame (4).

17. The coaxial connector of claim 13 wherein the contact sleeves (14) are detachable from the carrier frame (4).

18. The coaxial connector of claim 13 wherein the contact carrier housing (2) includes a bottom region (26) defining recesses (27) therein, the carrier frame (4) including interconnection webs (16) which are insertable into the recesses (27).

19. The coaxial connector of claim 11 wherein the contact carrier housing (2) includes an outer contact body (29), at least one outer socket (28) and outer contact terminals (24).

* * * * *